United States Patent
Birkett et al.

(10) Patent No.: US 7,394,874 B2
(45) Date of Patent: *Jul. 1, 2008

(54) UP/DOWN CONVERSION CIRCUITRY FOR RADIO TRANSCEIVER

(75) Inventors: Alexander Neil Birkett, Richmond (CA); James Stuart Wight, Ottawa (CA)

(73) Assignee: Zarbana Digital Fund LLC, Wilmington, DE (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/676,652

(22) Filed: Feb. 20, 2007

(65) Prior Publication Data

US 2007/0202815 A1 Aug. 30, 2007

Related U.S. Application Data

(63) Continuation of application No. 10/154,282, filed on May 22, 2002, now Pat. No. 7,194,044.

(51) Int. Cl.
*H04L 27/16* (2006.01)
(52) U.S. Cl. ........................ 375/324; 375/261; 375/340; 455/154.1; 455/165.1; 455/189.1; 455/190.1; 455/323; 329/308; 329/324; 329/359
(58) Field of Classification Search ................ 375/259, 375/261, 268, 271, 316, 320, 322, 324, 326, 375/327, 340; 329/302, 323, 306–308, 346, 329/358–360; 455/150.1, 154.1, 165.1, 189.1, 455/190.1, 208, 209, 313, 323, 324
See application file for complete search history.

(56) References Cited

U.S. PATENT DOCUMENTS

| | | | |
|---|---|---|---|
| 5,590,413 | A | 12/1996 | Kondratiev et al. |
| 5,761,615 | A | 6/1998 | Jaffee |
| 5,794,131 | A | 8/1998 | Cairns |
| 5,812,591 | A | 9/1998 | Shumaker et al. |

(Continued)

OTHER PUBLICATIONS

Lam et al., "A 2.6 GHz/5.2 GHz Frequency Synthesizer in 0.4 µm CMOS Technology", IEEE Journal of Solid State Circuits, vol. 35, No. 5, pp. 788 et seq., May 2000.
Behbahani et al., "A 2.4 GHz Low-IF Receiver for Wideband WLAN in 0.6 µm CMOS Architecture and Front End", IEEE Journal of Solid State Circuits, vol. 35, No. 12, pp. 1908 et seq., Dec. 2000.

(Continued)

*Primary Examiner*—Dac V. Ha
(74) *Attorney, Agent, or Firm*—Stolowitz Ford Cowger LLP

(57) ABSTRACT

A multi-channel RF receiver uses an image rejection mixer (e.g. double quadrature mixer) in the IF down conversion stage for image side band rejection (whereby use of an IF narrow band filter for image rejection may be omitted if desired) and comprises a simplified frequency synthesizer which generates both a "wandering" IF oscillator frequency and an RF oscillator frequency for the up/down conversion stages (being, for down conversion, from RF to IF and from IF to base band. The IF used for a particular RF carrier (channel) is selected so as to be both an integer (N) sub-harmonic of that RF carrier and within the operating frequency band of the image rejection mixer. Advantageously, the synthesizer comprises only one loop and one VCO, wherein the IF oscillator signal is produced from the RF oscillator signal by means of a frequency divider.

21 Claims, 5 Drawing Sheets

U.S. PATENT DOCUMENTS

| | | |
|---|---|---|
| 5,995,815 A | 11/1999 | Blom |
| 6,091,963 A | 7/2000 | Mannerstraale et al. |
| 6,195,563 B1 | 2/2001 | Samuels |
| 6,256,511 B1 | 7/2001 | Brown et al. |
| 6,259,895 B1 * | 7/2001 | Yoshikawa et al. ............ 455/73 |
| 6,308,048 B1 | 10/2001 | Gore et al. |
| 6,631,255 B1 * | 10/2003 | Claxton et al. .............. 455/203 |
| 6,961,546 B1 | 11/2005 | Rofougaran et al. |
| 6,961,547 B2 | 11/2005 | Rozenblit et al. |
| 7,058,364 B2 | 6/2006 | Atkinson et al. |
| 2003/0035493 A1 | 2/2003 | Mollenkopf |

OTHER PUBLICATIONS

Behbahani et al., "CMOS Mixers and Polyphase Filters for Large Image Rejection", IEEE Journal of Solid State Circuits, vol. 36, No. 6, pp. 873 et seq., Jun. 2001.

Gray et al., "Circuit Design for Wireless Communications", EUROTECH Course Proceedings, Lausanne, Switzerland, Jun. 25-29, 2001. (page number not known).

* cited by examiner

| RECEIVER LO1 (RF) (MHz) | RECEIVER LO2 (IF) (MHz) | DIVIDE RATIO M |
|---|---|---|
| 4662 | 518 | 259 |
| 4680 | 520 | 260 |
| 4698 | 522 | 261 |
| 4716 | 524 | 262 |
| 4734 | 526 | 263 |
| 4752 | 528 | 264 |
| 4770 | 530 | 265 |
| 4788 | 532 | 265 |

Figure 5

UP/DOWN CONVERSION CIRCUITRY FOR RADIO TRANSCEIVER

CROSS-REFERENCE TO RELATED APPLICATION

This application is a continuation of U.S. patent application Ser. No. 10/154,282, filed on May 22, 2002, now U.S. Pat. No. 7,194,044 which is incorporated by reference in its entirety.

FIELD OF THE INVENTION

The invention relates to circuitry for a radio transceiver and in particular to up and down conversion circuitry which uses a single frequency synthesizer for both the RF (radio frequency) and IF (intermediate frequency) stages of frequency up and down conversion.

BACKGROUND

In the transmitter portion of a transceiver used for communicating digital data, a baseband information signal is typically scrambled, encoded, and interleaved before being modulated and then up-converted to a radio frequency, and amplified, for radio (wireless) transmission. The receiver portion of the transceiver performs the reverse processes including down-converting a received RF signal to baseband.

As is well known by persons skilled in the art, in a traditional heterodyne receiver the up and down conversion from baseband to RF and from RF to baseband, respectively, is done in two stages to introduce an intermediary frequency (IF). In the up conversion process (converting from baseband to RF), a first stage uses an IF oscillator signal and a second stage uses an RF oscillator signal. This two-stage process is used because the side band signals (referred to as the image side band and the desired side band) that would result from a single stage up or down conversion would require the use of a high Q, off-chip filter to extract the information signal (representing a relatively high cost solution).

For the two-stage up conversion process in the transmitter, the baseband information signal is first converted to an IF band information signal (this first stage being the up-conversion IF stage) by multiplying the baseband signal by an IF oscillator signal using a mixer. This produces two side band signals centred around the IF. To extract the IF band information signal a narrow band filter is used (i.e. this filter being sufficiently narrow to exclude any signals in the undesired image band or IF carrier feed-through signal). In the second stage (being the up-conversion RF stage) the filtered IF band information signal is again converted to a higher frequency band, this time to an RF band information signal, by multiplying the IF band information signal by an RF oscillator signal using a mixer. This produces two side band signals centred around the RF but, because the frequency spread between them is at least twice the IF, the desired band signal can be filtered out using a relatively simple (low Q) band pass filter.

In a multi-channel transceiver several different adjacent band RF information signals are received. At each down conversion stage of the receiver, this results in the presence of undesired signals in the image band for a desired information signal and these undesired signals must be excluded. For the first down conversion stage (referred to herein as the down conversion RF stage), a mixer multiplies the RF information signal by an RF oscillator signal and this results in adjacent band RF signals being translated to adjacent band IF signals. To extract the desired IF band information signal from these other adjacent band signals, a narrow band filter is used. In the second stage (referred to herein as the down conversion IF stage) the extracted IF band information signal is again down-converted by multiplying the IF band information signal by an IF oscillator signal using a mixer. This produces the desired base band information signal.

In the foregoing traditional heterodyne down conversion architecture it is necessary to provide a sufficiently low IF frequency to permit sufficient filtering to occur to achieve high levels of rejection of the adjacent band signals, and in particular, the image side band signals.

More recently, with the development of an on-chip double quadrature mixer (also known as a complex mixer), a new receiver architecture is being proposed which would use the good tracking ability of a double-quadrature mixer to achieve substantial rejection (e.g. 40 dB) of the undesired image band signal. It is proposed in the industry that such use of a double-quadrature mixer will be used in conjunction with use of the narrow band IF filter of the traditional architecture to complement the results of filtering. As for the traditional architecture, this new architecture which makes use of a double-quadrature mixer topology is also limited to a relatively low IF because the known double-quadrature mixers are non-operative at high RF frequencies. It is known that a realizable double-quadrature mixer is presently limited to maximum operating frequency of about 500 MHz.

Since the usage of a narrow band filter at the IF frequency band fixes the IF frequency, the known heterodyne receiver architectures require a frequency synthesizer that is able to "tune" all RF channel frequencies to a single IF frequency. For example, for a receiver designed to receive RF information signals in accordance with the 802.11a 5 GHz wireless standard, the receiver must be able to tune to each of the 8 different RF channels defined by this standard. In addition, it must provide a constant value IF oscillator signal to down-convert the IF band information signal to base band. This need for both a tunable and a fixed frequency signal for the heterodyne down-conversion process has been fulfilled in known receivers by a relatively complex frequency synthesizer design incorporating at least two feedback loops with individual VCO's (voltage controlled oscillators).

Accordingly, there is a need for an improved design for transceiver up and down converters. In addition, there is a need for a transceiver up and down converter using a simplified frequency synthesizer.

SUMMARY OF THE INVENTION

In accordance with the invention down conversion circuitry is provided for use in a radio transceiver for down converting, in two stages, a received RF information signal to a base band information signal, wherein a first stage converts the RF information signal to an IF information signal and a second stage converts the IF information signal to the base band information signal. A mixer component down converts the RF information signal to the IF information signal using an RF oscillator signal. An image rejection mixer component (e.g. a double quadrature mixer) down converts the IF information signal to the base band signal using an IF oscillator signal, the down converting achieving substantial image signal rejection (e.g. 40 dB). A frequency synthesizer generates each of the RF and IF oscillator signals whereby the IF oscillator signal is an integer (N) sub-harmonic of the RF oscillator signal and the frequency value of the IF oscillator signal is pre-selected to be within the operating frequency band of the image rejection mixer component. For use in a multiple channel transceiver, the frequency synthesizer generates RF and IF oscillator signals for each channel of the multiple channels and each IF oscillator signal is of a different frequency from one channel to another.

The frequency synthesizer preferably comprises a first frequency divider configured for dividing the RF oscillator signal frequency for each channel by an integer value N to produce the IF oscillator signal for that channel. A single feedback loop is preferably included, comprising a second frequency divider, a reference frequency source, multiplier means, low pass filter means and a voltage controlled oscillator wherein the RF oscillator signal is derived from the output of the voltage controlled oscillator. The second frequency divider is configured for dividing the output of the voltage controlled oscillator by a preselected integer value M calculated to establish a desired frequency for the output of the voltage controlled oscillator based on the reference frequency wherein a different value of M is preselected for each channel to establish an RF oscillator signal associated with that channel. In one exemplary embodiment the RF oscillator signals are spaced 18 MHz apart for the multiple channels, the IF oscillator signals are spaced 2 MHz apart for the multiple channels and the value N is 9.

Also in accordance with the invention there is provided a method for down converting, in two stages, a received RF information signal to a base band information signal wherein a first stage converts the RF information signal to an IF information signal and a second the stage converts the IF information signal to the base band information signal. The RF information signal is down converted to the IF information signal using an RF oscillator signal. The IF information signal is down converted to the base band signal using image rejection down conversion means for achieving substantial image signal rejection and an IF oscillator signal. Each of the RF and IF oscillator signals is generated whereby the IF oscillator signal is an integer (N) sub-harmonic of the RF oscillator signal, including preselecting the frequency value of the IF oscillator signal to be within the operating frequency band of the image rejection down conversion means. The method may be applied for use in a multiple channel radio transceiver whereby the RF and IF oscillator signals are generated for each channel of the multiple channels and each of the IF oscillator signals has a different frequency from one channel to another.

The invention further provides up conversion circuitry for use in a radio transceiver comprising an image rejection mixer component configured for up converting the base band information signal to the IF information signal using an IF oscillator signal, said up converting achieving substantial image signal rejection; a mixer component configured for up converting the IF information signal to the RF information signal using an RF oscillator signal; and, a frequency synthesizer configured for generating each of the RF and IF oscillator signals whereby the IF oscillator signal is an integer (N) sub-harmonic of the RF oscillator signal and the frequency value of the IF oscillator signal is preselected to be within the operating frequency band of the image rejection mixer component.

A method for up converting a base band information signal to an RF information signal is also provided and comprises up converting the base band information signal to the IF information signal using image rejection up conversion means and an IF oscillator signal, whereby substantial image signal rejection is achieved; up converting the IF information signal to the RF information signal using an RF oscillator signal; and, generating each of the RF and IF oscillator signals whereby the IF oscillator signal is an integer (N) sub-harmonic of the RF oscillator signal, including preselecting the frequency value of the IF oscillator signal to be within the operating frequency band of the image rejection up conversion means.

BRIEF DESCRIPTION OF THE DRAWINGS

An embodiment of the present invention is described in detail below with reference to the following drawings in which like references pertain to like elements throughout.

DETAILED DESCRIPTION OF ILLUSTRATED EMBODIMENT

Figure 1:
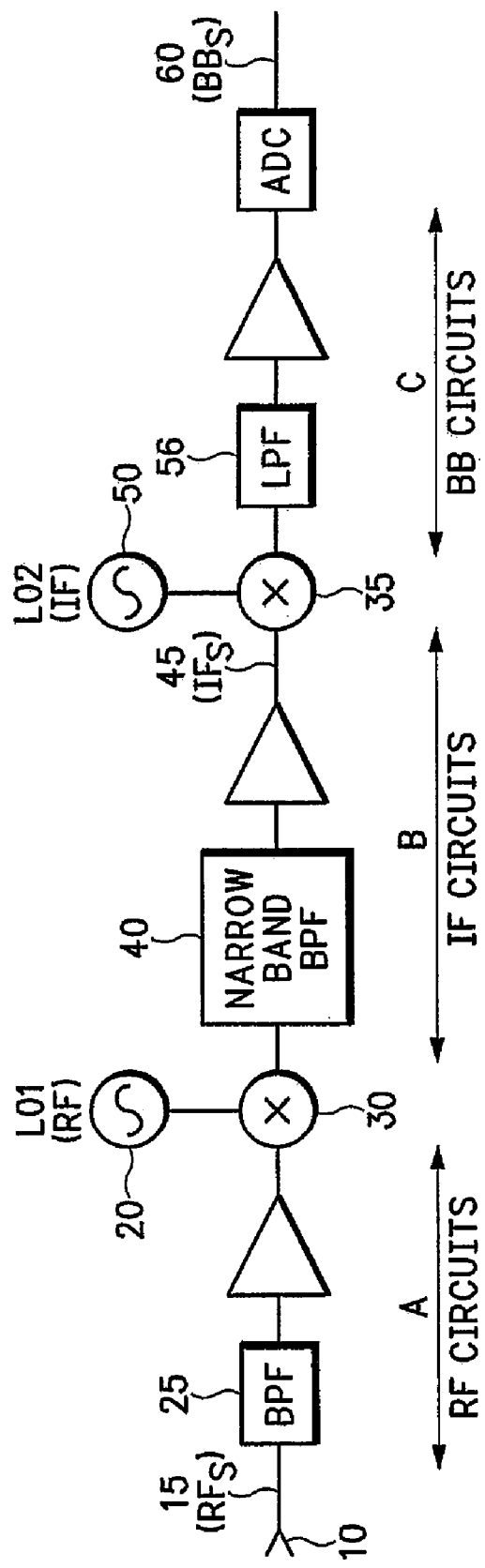
FIG. 1 is a schematic block diagram of a prior art traditional heterodyne receiver architecture.

A circuit architecture for the traditional prior art heterodyne receiver is shown in FIG. 1 in which a local oscillator LO1 20, providing an RF oscillator signal, is used for a first down conversion of an RF band information signal ($RF_s$) to an IF band signal using a mixer component 30, a second local oscillator LO2 50, providing an IF oscillator signal, is used for a second down conversion of the IF band information signal ($IF_s$) 45 to base band using a mixer 35 and a narrow band filter (BPF) 40 is provided to extract the $IF_s$ signal 45 at the IF stage prior to the second down conversion. For a multi-carrier application, such as an embodiment implementing the 802.11a 5 GHz wireless standard, the local oscillator LO1 20, providing the RF oscillator signal, must be tunable to multiple RF carrier frequencies.

Figure 2:
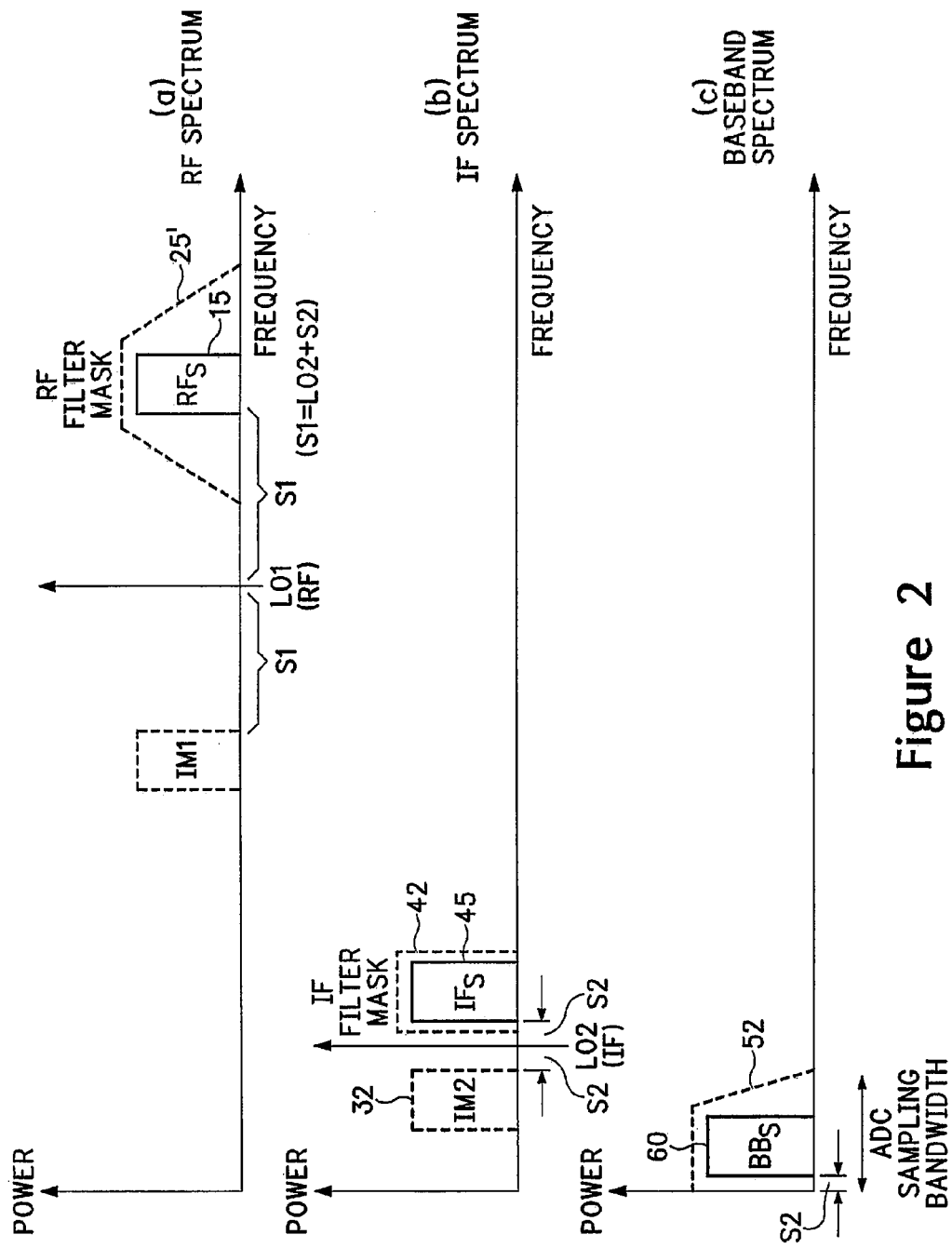
FIGS. 2(a), (b) and (c) are frequency spectrum graphs illustrating the relevant frequency spectrum occupied by signals received by a multi-channel transceiver during the RF, IF and BB (base band) down conversion stages, respectively.

FIG. 2(a) illustrates portions of the frequency spectrum occupied by an exemplary RF signal received at a multi-channel receiver antenna 10 and FIGS. 2(b) and (c) illustrate portions of the occupied frequency spectrum following the RF and IF down conversion stages, respectively. As shown by the filter mask outline 25' in FIG. 2(a), the received RF information signal ($RF_s$) 15 is extracted from the received signal by a band pass filter 25 so as to exclude signals in the adjacent band IM1. As is well understood in the art of radio communications, the frequency separation. S1 between the RF local oscillator LO1 and the start of the $RF_s$ band is equal to IF (the intermediate frequency used to down convert the signal to baseband) plus any amount S2 that may apply. As shown by FIG. 2(b) the first down conversion of $RF_s$ results in both an image side band signal IM2 32 and the desired IF information signal $IF_s$ 45 in close proximity thereto in the frequency spectrum (since the spectral bandwidth S2 between each of the signals $IF_s$ and IM2 and the local oscillator LO2 is just the small amount of bandwidth between DC and the start of the base band information signal $BB_s$, as shown by FIG. 2(c)). Because the bandwidth S2 is relatively small it is necessary that a narrow band filter be used, as shown by the dotted outline 42, to extract the desired signal $IF_s$. FIG. 2(c) shows the result of the second down conversion of the information signal from IF to base band where the base band information signal $BB_s$ is extracted using a low pass filter 56 as shown by the dotted outline 52

Figure 3:
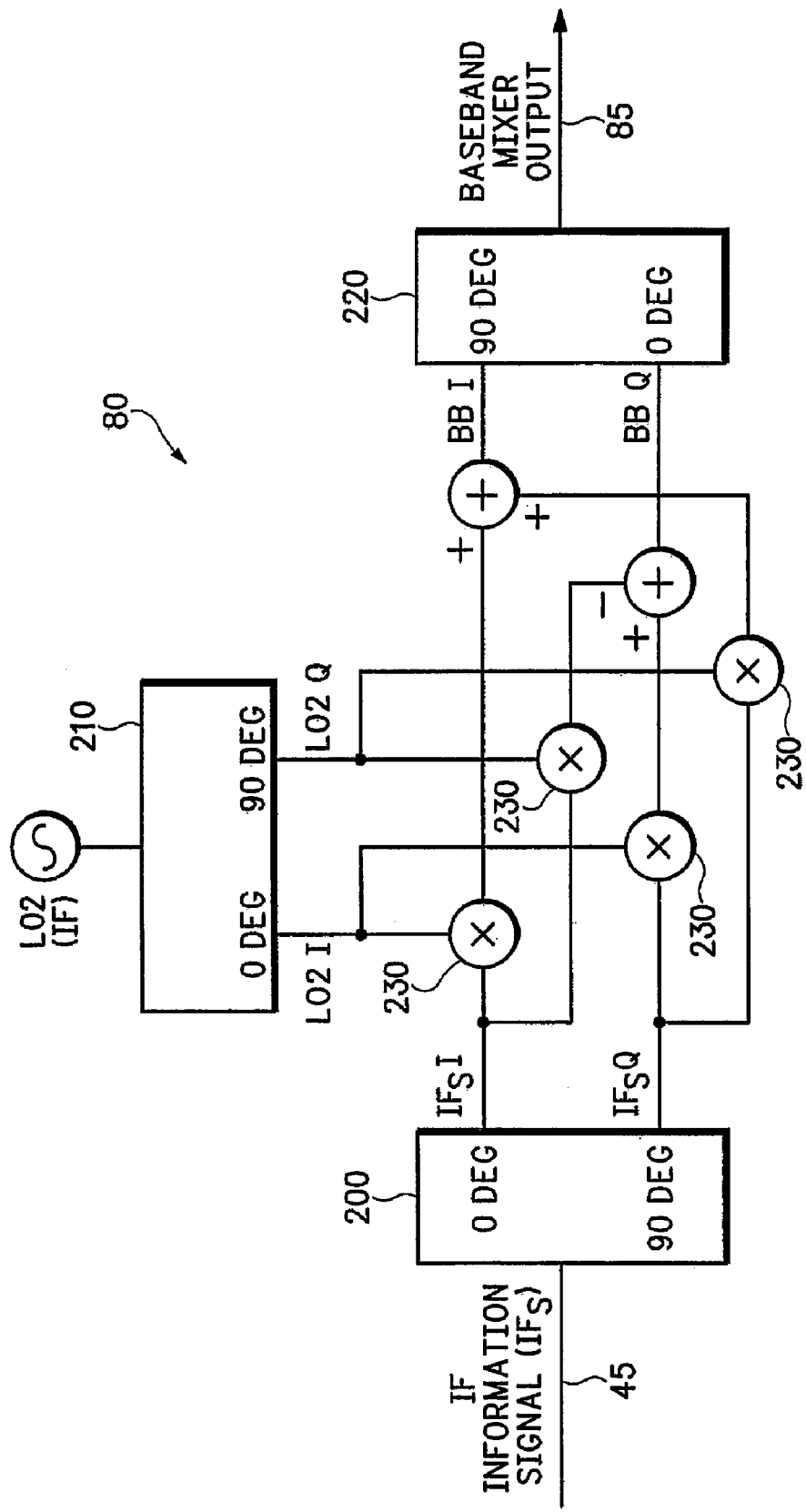
FIG. 3 is a schematic block diagram of a component topology for a prior art circuit of an image rejection complex (double quadrature) mixer.

FIG. 3 is a schematic block diagram of a component topology for prior art circuitry for a double quadrature (complex) mixer 80. As is well-known in the art the double quadrature mixer 80 processes an input signal comprising a desired IF band information signal and an undesired IF image band signal to produce a base band output signal 85 comprising the information signal of the desired IF band and, at the same time, reject the signal of the undesired image band. The input signal, which comprises the $IF_s$ signal 45 in FIG. 3, is split into its quadrature components using a quadrature splitter 200 which calculates, in real time, the sine and cosine of the time varying phase of the input signal including that of the $IF_s$ signal. Another quadrature splitter 210 produces quadrature oscillator signals. Combinations of these quadrature signals are multiplied by four mixers 230, as illustrated, and the multiplier outputs are added together and combined by a quadrature signal combiner 220 to produce a base band output 85 of which any undesired image band signal component has been substantially rejected (e.g. signal rejection of 40 dB or more). As such, the mixer 80 is more generally referred to hereinafter as an image rejection mixer component. The meaning of the term image rejection mixer component herein means any suitable mixer, without limitation to a double quadrature mixer as used in the illustrated embodiment, configured to achieve substantial image rejection.

The inventor has determined that in a receiver employing the more recent circuit architecture (i.e. an architecture which uses a complex i.e. double quadrature mixer in the IF down conversion stage for image side band rejection), the image rejection achieved by the complex mixer is sufficient to avoid any need to also use an IF narrow band pass filter to extract $IF_s$ and reject (exclude) the IF image IM2. Further, the inventor has developed an improved receiver architecture, comprising a simplified frequency synthesizer, which takes advantage of this determination. Specifically, the inventor has developed a receiver which uses preselected "wandering" IF frequencies whereby the IF band signal changes in direct relationship to changes from one RF frequency channel to another. The inventor's novel use of a wandering IF frequency in the down conversion circuitry of the receiver is combined with a realization of the IF oscillator signal as an integer sub-harmonic of the received RF oscillator signal. As a result, the synthesizer of the down conversion circuitry of the invention advantageously comprises only one synthesizer loop 100 (see FIG. 4), wherein the IF oscillator signal is produced from the RF oscillator signal by means of a simple frequency divider 105 (see FIG. 4).

Figure 4:
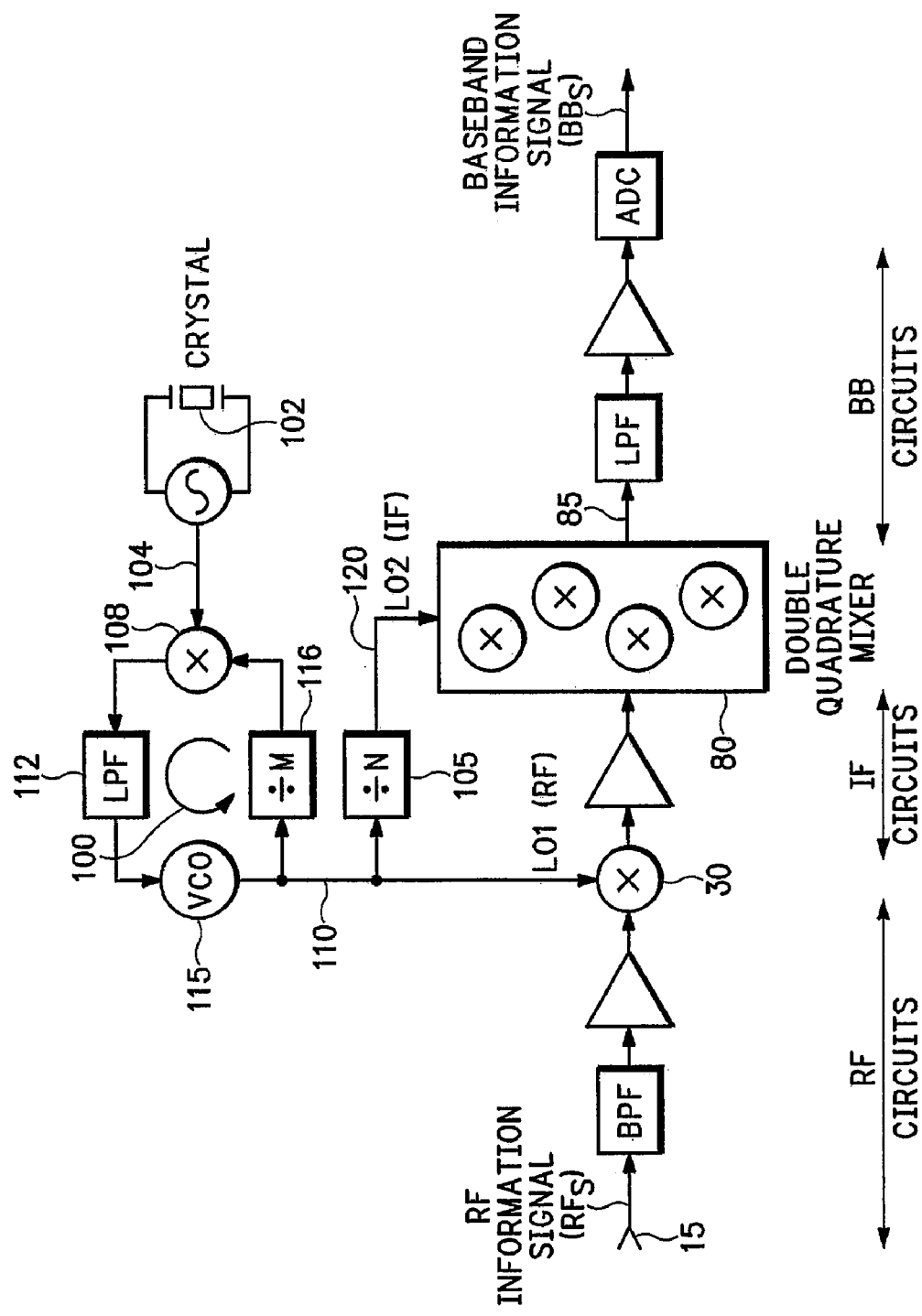
FIG. 4 is a schematic block diagram of a wandering IF heterodyne receiver architecture in accordance with the invention in which a double quadrature mixer is used to achieve image side band rejection at the IF stage and the RF and IF oscillator signals are generated from the same frequency synthesizer; and, FIG. 5 is a table showing exemplary frequencies (LO1 and LO2) generated from the frequency synthesizer illustrated in FIG. 4 together with the corresponding integer values of M for the frequency divider within the synthesizer loop of FIG. 4.

FIG. 4 illustrates, in schematic block diagram form, a wandering IF heterodyne receiver architecture in accordance with the invention. An image rejection mixer component 80, in the illustrated embodiment being a double quadrature mixer, is used to achieve image side band rejection at the IF stage and any use of a band pass filter to exclude undesired signals is optional only (not required). Since there is no longer a need for the prior art narrow band pass filter (such as filter 40), there is also no longer a need for the prior art limitation requiring a single fixed IF matched to such a filter. Instead, in accordance with the invention, the IF used for a particular RF carrier (channel) is preselected so as to be both an integer (N) sub-harmonic of that RF carrier and within the operating frequency band of the selected image rejection mixer component 80. For the down conversion circuitry of the illustrated embodiment of FIG. 4, which complies with the 802.11a 5 GHz wireless standard, the eight RF LO1 signals are those in the first column of the table of FIG. 5. As shown, the LO1 signals are spaced 18 MHz apart, starting at 4662 MHz and ending at 4788 MHz. The corresponding preselected IF oscillator signals LO2, starting at 518 MHz and ending at 532 MHz, are integer (N) sub-harmonics of those LO1 signal frequencies and obtained therefrom by means of a frequency divider 105 of which the division value N is 9.

Advantageously, because of the ability for the IF oscillator frequency to "wander" (i.e. to not be fixed to a narrow band pass filter frequency) in the down conversion circuitry of this invention and, in turn, the integer relationship between the RF and IF oscillator signals, a simplified frequency synthesizer is used to generate the RF and IF oscillator signals. A single frequency synthesizer loop 100 is provided to generate all of the LO1 and LO2 signals required for a multi-channel receiver. As shown by FIG. 4, a reference frequency signal 104 is provided by a crystal 102 and this is input to the synthesizer feedback loop 100 comprising a multiplier 108, a low pass filter 112, a voltage controlled oscillator (VCO) 115 and a frequency divider 116. The frequency of the output of the voltage controlled oscillator 115 is locked by the loop 100 at a preselected frequency value for LO1 (the RF oscillator signal), based on the value applied to M. This is because the VCO output is divided by the frequency divider 116 and the signal produced by the divider is multiplied by the reference frequency such that any difference between the inputs to the multiplier results in a proportional signal being output from the filter 112 which would then change the VCO input and output until a steady state output is produced by the VCO equal to M times the reference frequency.

For the synthesizer of the illustrated embodiment a reference frequency of 18 MHz is selected and, accordingly, the integer values of M shown in FIG. 5 are preselected to produce the desired LO1 frequencies for a particular 802.11a 5 GHz application based on the particular reference frequency selected. The values of M shown in FIG. 5 are calculated to produce the corresponding LO1 frequencies shown in the left-hand column of FIG. 5, these being the preselected RF oscillator signal frequencies of a multi-channel (viz. 8 channel) 802.11a 5 GHz transceiver. For example, the first preselected RF frequency (LO1) is 4662 MHz so the value of M is required to be 259 for a reference frequency of 18 MHz (i.e. 4662÷259=18). Each of the values of M are selected in similar manner for the corresponding RF oscillator signal use for the particular channel to which M is applied.

It is to be understood that in accordance with the present invention claimed herein it is not intended to limit the up/down conversion circuitry to any particular RF stage mixer component. For example, the mixer component 30 shown in FIG. 4 could be a quadrature mixer (i.e. two mixers) or a single mixer. Equally, the input and output signals of the image rejection mixer component 80 could be real or complex depending upon the specific circuit configuration selected for a particular application. It is also to be understood that although the exemplary circuitry shown in FIG. 4 does not include a band pass filter (BPF) between the RF mixer 30 and the image rejection mixer component 80, it may be desired for a particular application to include such a filter. If such a BPF is selected for use, however, its pass band must be wide enough to encompass all desired IF bands in a multi-channel transceiver application and it may take the form of a real BPF, a complex BPF (producing gain in the pass band) or a polyphase passive BPF.

It will be understood by persons skilled in the art that although the invention is illustrated herein with reference to down conversion circuitry in a receiver it may, also, be implemented in up conversion circuitry in a transmitter in similar but reverse manner to the down conversion implementation herein described.

The individual electronic and processing functions utilised in the foregoing described embodiment are, individually, well understood by those skilled in the art. It is to be understood by the reader that a variety of other implementations may be devised by skilled persons for substitution. Persons skilled in the field of radio communication design will be readily able to apply the present invention to an appropriate implementation means for a given application.

Consequently, it is to be understood that the particular embodiments shown and described herein by way of illustration is not intended to limit the scope of the inventions claimed by the inventor which are defined by the appended claims.

What is claimed is:

1. Down conversion circuitry for use in a radio transceiver for down converting a received RF information signal to a base band information signal in two stages wherein a first said stage converts said RF information signal to an IF information signal and a second said stage converts said IF information signal to said base band information signal, said down conversion circuitry comprising:
   a mixer component configured for down converting said RF information signal to said IF information signal using an RF oscillator signal;
   an image rejection mixer component configured for down converting said IF information signal to said base band signal using an IF oscillator signal and achieving image signal rejection of said IF information signal; and
   a frequency synthesizer configured for generating one or more of said RF or IF oscillator signals, or combinations thereof, wherein said IF oscillator signal is an integer (N) sub-harmonic of said RF oscillator signal and a frequency value of said IF oscillator signal is selected to be within an operating frequency band of said image rejection mixer component.

2. Down conversion circuitry according to claim 1 wherein image signal rejection of said IF information signal comprises a magnitude of at least 40 dB.

3. Down conversion circuitry according to claim 2 wherein said image rejection mixer component comprises a double quadrature mixer.

4. Down conversion circuitry according to claim 1 wherein said frequency synthesizer is capable of generating RF or IF oscillator signals, or combinations thereof, for one or more channels of a multiple channel transceiver; and
   wherein one or more of the IF oscillator signals comprises a different frequency from one of the channels to another.

5. Down conversion circuitry according to claim 4 wherein said frequency synthesizer comprises a first frequency divider configured for dividing the RF oscillator signal frequency for one or more of the channels by an integer value N to produce the IF oscillator signal for the channels.

6. Down conversion circuitry according to claim 5 wherein said frequency synthesizer comprises a feedback loop and said first frequency divider, said feedback loop comprising a second frequency divider, a reference frequency source, multiplier means, low pass filter means and a voltage controlled oscillator wherein said RF oscillator signal derives from the output of said voltage controlled oscillator, said second frequency divider being configured for dividing said output of said voltage controlled oscillator by an integer value M calculated to establish a desired frequency for said output of said voltage controlled oscillator based on said reference frequency, wherein a different value of M is selected for each said channel to establish an RF oscillator signal associated with said channel.

7. Down conversion circuitry according to claim 6 wherein said RF oscillator signals are spaced 18 MHz apart for said multiple the channels, and said IF oscillator signals are spaced 2 MHz apart for channels and said value N is 9.

8. A method for use in a radio transceiver for down converting, in two stages, a received RF information signal to a base band information signal wherein a first said stage converts said RF information signal to an IF information signal and a second said stage converts said IF information signal to said base band information signal, said method comprising:
   down converting said RF information signal to said IF information signal using an RF oscillator signal;
   down converting said IF information signal to said base band signal to provide image signal rejection, and an IF oscillator signal; and
   generating one or more of said RF or IF oscillator signals, or combinations thereof, wherein said IF oscillator signal comprises an integer (N) sub-harmonic of said RF oscillator signal, said generating including selecting the frequency value of said IF oscillator signal to he within an operating frequency band of said down converting said IF information signal.

9. The method according to claim 8 said down converting said IF information signal results in image signal rejection of at least 40 dB.

10. The method according to claim 8 wherein said RF or IF oscillator signals, or combinations thereof, are generated for one or more channels of a multiple channel transceiver and one or more of said IF oscillator signals has a different frequency from one or more other channels.

11. The method according to claim 10 wherein said generating comprises dividing one or more of said RF oscillator signal frequencies for one or more of said channels by an integer value N to produce said IF oscillator signal for said channel.

12. The method according to claim 11 wherein said generating uses a feedback loop comprising a second frequency divider, a reference frequency source, multiplier means, low pass filter means and a voltage controlled oscillator wherein said RF oscillator signal is derived from an output of said voltage controlled oscillator and said output is divided by an integer value M calculated to establish a desired frequency for said output based at least in part on said reference frequency.

13. The method according to claim 12, wherein a different value of M is selected for one or more of said channels to establish an RF oscillator signal associated with said channel.

14. The method according to claim 13 wherein said RF oscillator signals are spaced 18 MHz apart for one or more of said channels, and said IF oscillator signals are spaced 2 MHz apart for one or more of said channels and said value N is 9.

15. An apparatus, comprising:
   means for down converting an RF information signal to an IF information signal using an RF oscillator signal;
   means for down converting the IF information signal to a base band signal to provide image signal rejection, and to provide an IF oscillator signal; and
   means for generating one or more of the RF oscillator signal or the IF oscillator signal, or combinations thereof, wherein the IF oscillator signal comprises an integer (N) sub-harmonic of the RF oscillator signal, and for selecting the frequency value of the IF oscillator signal to be within an operating frequency band of said IF information signal down converting means.

16. The apparatus as claimed in claim 15, wherein said IF information signal down converting means is capable of providing image signal rejection of at least 40 dB.

17. The apparatus as claimed in claim 15, wherein the RF oscillator signal or the IF oscillator signal, or combinations thereof, are generated for one or more channels of a multiple channel transceiver and one or more IF oscillator signals of one or more channels has a different frequency from the IF oscillator signal of one or more other channels.

18. The apparatus as claimed in claim 17 wherein said generating means comprises means for dividing one or more of the RF oscillator signal frequencies for one or more of the channels by an integer value N to produce the IF oscillator signal for the channel.

19. The apparatus as claimed in claim 18, wherein said generating means uses a feedback loop comprising a second frequency divider, a reference frequency source, multiplier means, low pass filter means and a voltage controlled oscillator wherein the RF oscillator signal is derived from an output of the voltage controlled oscillator and the output is divided by an integer value M calculated to establish a desired frequency for the output based at least in part on the reference frequency.

20. The apparatus as claimed in claim 19, wherein a different value of M is selected for one or more of the channels to establish an RF oscillator signal associated with the channel.

21. The apparatus as claimed in claim 20 wherein the RF oscillator signals are spaced about 18 MHz apart for one or more of the multiple channels, and the IF oscillator signals are spaced about 2 MHz apart for one or more of said the channels and said value N is 9.

* * * * *

UNITED STATES PATENT AND TRADEMARK OFFICE
CERTIFICATE OF CORRECTION

PATENT NO.       : 7,394,874 B2
APPLICATION NO.  : 11/676652
DATED            : July 1, 2008
INVENTOR(S)      : Alexander Neil Birkett et al.

Page 1 of 1

It is certified that error appears in the above-identified patent and that said Letters Patent is hereby corrected as shown below:

At column 8, line 29, please delete "he" and insert --be--.

Signed and Sealed this

Third Day of August, 2010

David J. Kappos
*Director of the United States Patent and Trademark Office*